(12) United States Patent
Yagi et al.

(10) Patent No.: US 7,118,663 B2
(45) Date of Patent: Oct. 10, 2006

(54) ANODIC OXIDIZER, ANODIC OXIDATION METHOD

(75) Inventors: Yasushi Yagi, Tsukui-gun (JP); Kazutsugu Aoki, Tsukui-gun (JP); Mitsuru Ushijima, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 327 days.

(21) Appl. No.: 10/471,583

(22) PCT Filed: Nov. 6, 2002

(86) PCT No.: PCT/JP02/11551

§ 371 (c)(1),
(2), (4) Date: Sep. 12, 2003

(87) PCT Pub. No.: WO03/041147

PCT Pub. Date: May 15, 2003

(65) Prior Publication Data
US 2004/0084317 A1    May 6, 2004

(30) Foreign Application Priority Data
Nov. 8, 2001    (JP) .............................. 2001-342803

(51) Int. Cl.
*C25D 11/02* (2006.01)
(52) U.S. Cl. .................... 205/91; 205/92; 205/137; 205/146
(58) Field of Classification Search ............ 205/91, 205/92, 137, 146
See application file for complete search history.

(56) References Cited

U.S. PATENT DOCUMENTS

| | | | |
|---|---|---|---|
| 3,968,020 A | * | 7/1976 | Nagano et al. ............ 204/203 |
| 4,507,181 A | * | 3/1985 | Nath et al. ................. 205/91 |
| 4,569,728 A | * | 2/1986 | Davari et al. .............. 205/91 |
| 5,458,756 A | | 10/1995 | Bassous et al. |
| 5,501,787 A | | 3/1996 | Bassous et al. |
| 5,733,420 A | * | 3/1998 | Matsuda et al. ........... 204/203 |

FOREIGN PATENT DOCUMENTS

| | | |
|---|---|---|
| EP | 563625 | 10/1993 |
| JP | 51-135472 | 11/1976 |
| JP | 06-013366 | 1/1994 |
| JP | 7-099342 | 4/1995 |
| JP | 10-256225 | 9/1998 |

(Continued)

*Primary Examiner*—Roy King
*Assistant Examiner*—William T. Leader
(74) *Attorney, Agent, or Firm*—Crowell & Moring LLP

(57) ABSTRACT

An anodic oxidation apparatus and an anodic oxidation method are provided that enable uniform photoirradiation of a treatment part of a target substrate, thereby realizing enhancement in uniformity of anodic oxidation in the surface of the target substrate. The anodic oxidation apparatus includes: a lamp that emits light; a target substrate holder provided at a position reached by the emitted light and capable of holding the target substrate; a cathode electrode that is provided on the way of the emitted light to reach the target substrate and that has an opening portion to allow light to pass therethrough and has a conductor section not transmitting light; and a vibrating mechanism to periodically vibrate a spatial position of one of the cathode electrode, the lamp, and the target substrate holder. While the positional relationship among the three of the lamp, the cathode electrode, and the target substrate holder holding the target substrate is roughly maintained, the spatial position of at least one of the three is periodically vibrated, thereby dispersing the shadow of the cathode electrode on the target substrate with time.

12 Claims, 4 Drawing Sheets

FOREIGN PATENT DOCUMENTS

| | | |
|---|---|---|
| JP | 2000-100316 | 4/2000 |
| JP | 2000-164115 | 6/2000 |
| JP | 2001-85715 | 3/2001 |

* cited by examiner

FIG. 5
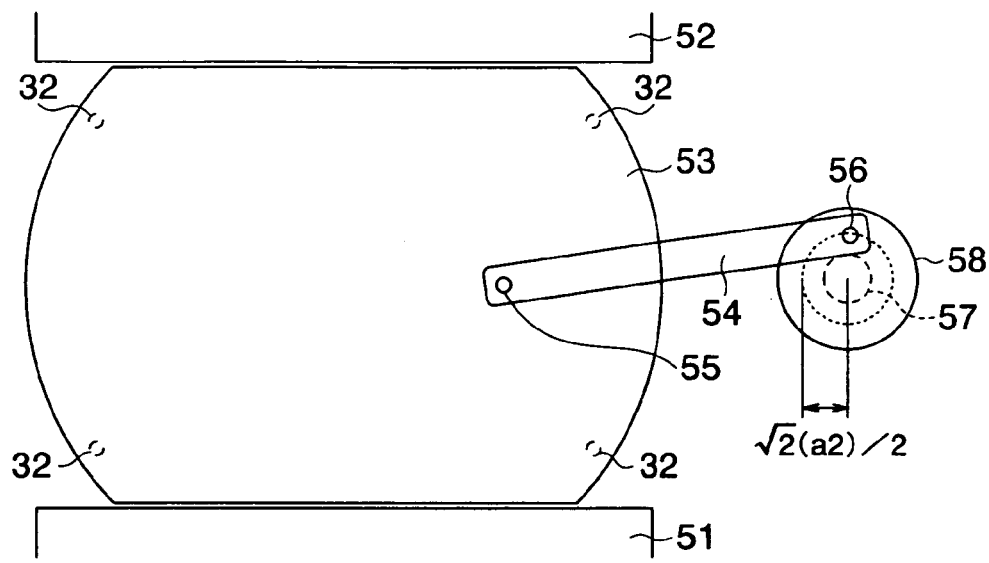
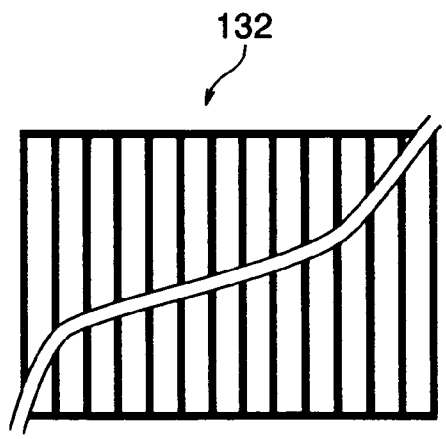
FIG. 6A
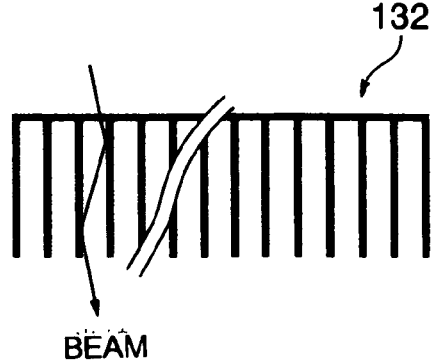
FIG. 6B

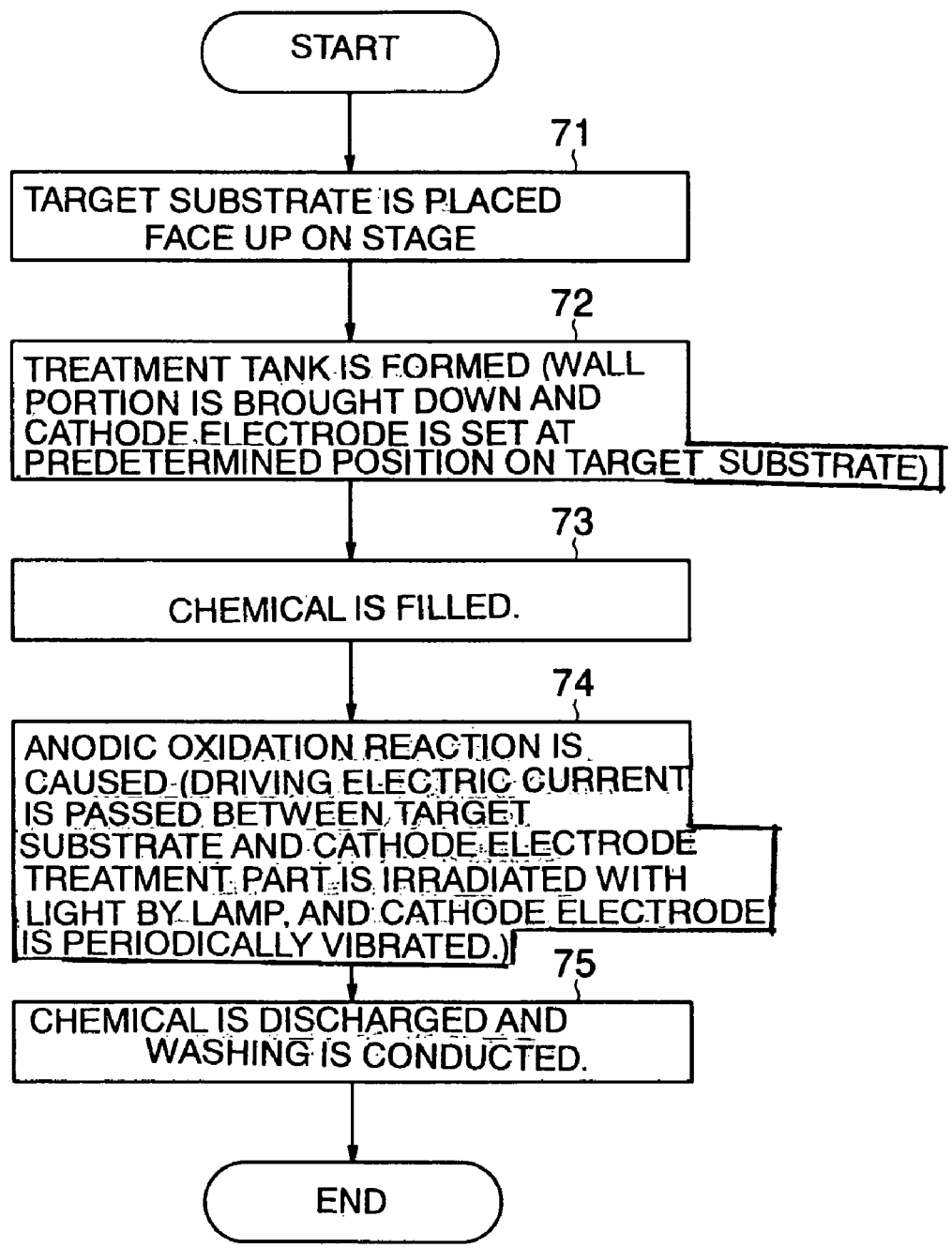

ANODIC OXIDIZER, ANODIC OXIDATION METHOD

TECHNICAL FIELD

The present invention relates to an anodic oxidation apparatus and an anodic oxidation method for electrochemically treating a target substrate which is an anode, more particularly, to the anodic oxidation apparatus and the anodic oxidation method suitable for anodic oxidation using photoirradiation in the treatment.

BACKGROUND ART

Electrochemical anodic oxidation of a target substrate is in use on various scenes. Such anodic oxidation includes treatment in which a polycrystalline silicon layer is made porous. The outline thereof is such that the target substrate having the polycrystalline silicon layer formed on the surface thereof is electrically connected to a positive potential pole of a power supply via a conductor and immersed in a hydrofluoric acid solution dissolved in a solvent (for example, ethyl alcohol). An electrode made of, for example, platinum is immersed in the hydrofluoric acid solution, in other words, in a chemical, and is electrically connected to a negative potential pole of the above-mentioned power supply. Further, the polycrystalline silicon layer on the target substrate immersed in the chemical is irradiated with light by a lamp.

This causes the polycrystalline silicon layer to partly melt in the hydrofluoric acid solution. Pores are formed where the polycrystalline silicon layer has been melted, so that the silicon layer is turned into a porous structure. The photoirradiation by the lamp is intended for producing holes necessary for the reaction of the above-mentioned melting and pore formation in the polycrystalline silicon layer. For reference, such reaction in the polycrystalline silicon layer in the anodic oxidation is explained, for example, as follows.

$$Si + 2HF + (2-n)e^+ \rightarrow SiF_2 + 2H^+ + ne^-$$

$$SiF_2 + 2HF \rightarrow SiF_4 + H_2$$

$$SiF_4 + 2HF \rightarrow H_2SiF_6$$

Here, $e^+$ is a hole and $e^-$ is an electron. Therefore, this reaction requires holes as a precondition and is different from simple electrolytic polishing.

The porous silicon thus produced is made suitable as a highly efficient field emission electron source by further forming a silicon oxide layer on a micro-level surface thereof, which is disclosed in, for example, Japanese Patent Laid-open No. 2000-164115, Japanese Patent Laid-open No. 2000-100316, and so on. The use of such a porous silicon as the field emission electron source has been drawing attention as opening a door to realizing a new flat display device.

In the anodic oxidation requiring the photoirradiation as described above, a cathode electrode is naturally positioned between the light emitting lamp and a treatment part of the target substrate. First, the cathode electrode needs to satisfy such a condition that it faces the entire surface of the treatment part thoroughly in terms of position so as to cause the treatment part to act uniformly. Meanwhile, the cathode electrode needs to allow the light emitted by the lamp to pass therethrough and to reach the treatment part.

For these purposes, for example, an electrode in a grid form having the same spread as a planar spread of the treatment part is used. Consequently, the cathode electrode can face the entire surface of the treatment part thoroughly in terms of position and allows the light to pass through opening portions in the grid so that the light reaches the treatment part.

Even when the electrode is made in the grid form, however, the shadow of the electrode in the grid form appears on the treatment part. Consequently, further minute observation would show that photoirradiation amounts on the treatment part are not uniform in the surface thereof, which poses some limit to uniformity of treatment as the anodic oxidation.

DISCLOSURE OF THE INVENTION

The present invention is made in consideration of the above-mentioned circumstances, and an object thereof is to provide an anodic oxidation apparatus and an anodic oxidation method for electrochemically treating a target substrate which is an anode, more particularly, to the anodic oxidation apparatus and the anodic oxidation method that enable uniform photoirradiation of a treatment part of the target substrate, thereby realizing enhancement in uniformity of anodic oxidation in the surface of the target substrate.

In order to solve the above-described problems, an anodic oxidation apparatus according to an aspect of the present invention is characterized in that it includes: a lamp that emits light; a target substrate holder provided at a position reached by the emitted light and capable of holding a target substrate; a cathode electrode that is provided on the way of the emitted light to reach the held target substrate and that has an opening portion to allow the light to pass therethrough and has a conductor section not transmitting the light; and a vibrating mechanism to periodically vibrate a spatial position of one of the cathode electrode, the lamp, and the target substrate holder (claim 1).

Specifically, while the positional relationship among the three of the lamp, the cathode electrode, and the target substrate holder that holds the target substrate is roughly maintained, the spatial position of at least one of the three is periodically vibrated. This causes the shadow of the cathode electrode on the target substrate to be dispersed with time. Accordingly, photoirradiation amounts to respective portions of the target substrate during the time required for the anodic oxidation step are averaged in an integral manner and are made uniform. Therefore, uniformity in anodic oxidation in the surface of the target substrate can be enhanced.

The determination on which one of the lamp, the cathode electrode, and the target substrate holder holding the target substrate should be vibrated can be made in consideration of device design cost and spatial configuration efficiency of each part. Further, the positional relationship among the three includes the horizontal arrangement which is intended for photoirradiation from a side direction, other than the vertical arrangement. The photoirradiation onto the target substrate may be guided via reflection, refraction, and so on. The "periodic vibration" means such a periodic movement that the locus on the displacement space does not fall outside a certain range, and includes any one of one-dimensional, two-dimensional, and three-dimensional movements.

An anodic oxidation apparatus according to another aspect of the present invention is characterized in that it includes: a target substrate holder capable of holding a target substrate; a wall member connected to the held target substrate, to form a treatment tank having an open upper portion; a treatment solution supply section to supply a treatment solution to the treatment tank; a lamp unit facing the held target substrate, to emit light to the held target substrate; a cathode electrode provided between the held target substrate and the lamp unit and having an opening portion to allow light to pass therethrough; and a vibrating mechanism to vibrate the cathode electrode relatively to the held target substrate (claim 2). This configuration also brings about substantially the same operation and effect as those described above.

As a preferable embodiment form of the present invention, the vibrating mechanism in the anodic oxidation apparatus as set forth in claim 1 or claim 2 vibrates one of the cathode electrode, the lamp, the lamp unit, and the target substrate holder on a plane substantially perpendicular to an irradiation direction of the emitted light (claim 3). The position of the produced shadow is varied with time on the target substrate.

As another preferable embodiment form of the present invention, the vibrating mechanism in the anodic oxidation apparatus as set forth in claim 1 or claim 2 vibrates one of the cathode electrode, the lamp, the lamp unit, and the target substrate holder on a plane substantially parallel to an irradiation direction of the emitted light (claim 4). The intensity pattern of the produced shadow is varied with time on the target substrate.

As still another preferable embodiment form of the present invention, the vibration in the anodic oxidation apparatus as set forth in claim 3 is one of a reciprocating movement, a circular movement, and an elliptic movement (claim 5). This is intended for realizing the movement by a simpler mechanism.

As yet another preferable embodiment form of the present invention, the vibration in the anodic oxidation apparatus as set forth in claim 4 is one of a reciprocating movement, a circular movement, and an elliptic movement (claim 6). This is also intended for realizing the movement by a simpler mechanism.

As yet another preferable embodiment form of the present invention, the cathode electrode in the anodic oxidation apparatus as set forth in claim 5 has a square grid structure with the conductor section having cross points, and the circular movement is a circular movement of the cathode electrode, a radius of the circular movement being an odd multiple of substantially a half of a distance between the cross points of the square (claim 7). This structure is intended for minimizing regions where the shadow of the cross points is concentrated due to the movement, in consideration of the fact that the shadow becomes darkest on the target substrate. Specifically, when the radius of the circular movement is set to an even multiple of substantially a half of the distance between the cross points of the square, the cross point is shifted to the adjacent cross point due to the movement, resulting in the concentration of the shadow of the cross points.

When the frequency of the above-mentioned circular movement as the periodic vibration is so selected that at least one period is completed in the time required for the anodic oxidation step, the photoirradiation amounts in this step are roughly averaged. Therefore, when the integral multiple of one period is completed in the time required for the anodic oxidation step, the averaging effect is obtainable, but when the integer thereof is set to be large, the significance of the exact integral multiple becomes relatively smaller, so that the obtained result is substantially the same as the result in the case of the real number multiple.

As yet another preferable embodiment form of the present invention, the cathode electrode in the anodic oxidation apparatus as set forth in claim 5 has a grid structure with the conductor section having cross points, and the reciprocating movement is a reciprocating movement of the cathode electrode in a diagonal distance direction, an amplitude of the reciprocating movement being an odd multiple of substantially a half of the diagonal distance between the cross points (claim 8). This structure is also intended for minimizing regions where the shadow of the cross points is concentrated due to the movement, in consideration of the fact that the shadow becomes darkest on the target substrate.

When the frequency of the above-mentioned reciprocating movement as the periodic vibration is so selected that at least a half of a period from the maximum to the minimum of an amplitude direction is completed in the time required for the anodic oxidation step, the photoirradiation amounts in the step are roughly averaged. Therefore, when the integer multiple of the half period is completed in the time required for the anodic oxidation step, the averaging effect is obtainable, but when the integer thereof becomes large, the significance of the exact integral multiple becomes relatively smaller, so that the obtained result is substantially the same as the result in the case of the real number multiple.

As yet another preferable embodiment form of the present invention, the cathode electrode in the anodic oxidation apparatus as set forth in claim 5 has a rectangular grid structure with the conductor section having cross points, and the elliptic movement is an elliptic movement of the cathode electrode, a major axis of the elliptic movement being an odd multiple of substantially a half of a longer side distance between the cross points and a minor axis of the elliptic movement being an odd multiple of substantially a half of a shorter side distance between the cross points (claim 9). This structure is also intended for minimizing regions where the shadow of the cross points is concentrated due to the movement, in consideration of the fact that the shadow becomes darkest on the target substrate.

Also in this case, when the frequency of the above-mentioned elliptic movement as the periodic vibration is so selected that at least one period is completed in the time required for the anodic oxidation step, the photoirradiation amounts in this step are roughly averaged. Therefore, when the integer multiple of one period is completed in the time required for the anodic oxidation step, the averaging effect is obtainable, but when the integer thereof becomes large, the significance of the exact integer multiple becomes relatively smaller, so that the obtained result is substantially the same as the result in the case of the real number integer.

As yet another preferable embodiment form of the present invention, the cathode electrode in the anodic oxidation apparatus as set forth in claim 6 is an assembly of plate-shaped members each having a main face substantially parallel to an irradiation direction of the emitted light (claim 10). When the light is made incident and reflected at a small angle on the main faces of the plate-shaped members substantially parallel to the light irradiation direction, the effect that the shadow is not easily made is additionally obtained.

An anodic oxidation method according to an aspect of the present invention is characterized in that it includes: holding a target substrate by a target substrate holder; bringing a treatment part of the held target substrate and a cathode electrode into contact with a chemical; supplying a driving electric current between the treatment part and the cathode electrode that are brought into contact with the chemical; irradiating the treatment part brought into contact with the chemical with light by a lamp; and periodically vibrating a spatial position of one of the cathode electrode brought into contact with the chemical, the target substrate holder, and the lamp while the cathode electrode is in contact with the chemical.

An anodic oxidation method according to another aspect of the present invention is characterized in that it includes: irradiating a target substrate brought into contact with a treatment solution with light; and vibrating, relatively to the target substrate, a cathode electrode that is disposed between a lamp unit facing the target substrate and the target substrate, and that has an opening portion to allow light to pass therethrough.

Specifically, while the positional relationship among the three of the lamp, the cathode electrode, and the target substrate holder holding the target substrate is roughly maintained, the spatial position of at least one of the three is periodically vibrated. This causes the shadow of the cathode electrode to be dispersed on the target substrate with time. Consequently, photoirradiation amounts to respective portions of the target substrate during the time required for the anodic oxidation step are averaged with time and are made uniform. Therefore, uniformity of anodic oxidation in the surface of the target substrate can be enhanced.

Incidentally, "supplying a driving electric current between the treatment part and the cathode electrode that are brought into contact with the chemical", "irradiating the treatment part brought into contact with the chemical with light by a lamp", and "periodically vibrating a spatial position of one of the cathode electrode brought into contact with the chemical, the target substrate holder, and the lamp while the cathode electrode is in contact with the chemical" are not necessarily performed in this order, but rather, the periods of time in which these steps are carried out can overlap one another.

Note that, when the cathode electrode is vibrated in the plane parallel to the face of the target substrate, the position of the produced shadow on the target substrate is varied with time, so that the photoirradiation amounts onto respective portions of the target substrate are averaged with time, as described above.

BRIEF DESCRIPTION OF DRAWINGS

FIG. 5 is a plan view showing an essential part of the cathode electrode vibrating mechanism 19 that can be used when a cathode electrode 131 shown in FIG. 4 is applied to the anodic oxidation apparatus shown in FIG. 1.

FIG. 6A and FIG. 6B are a plan view (FIG. 6A) and a front view (FIG. 6B) showing still another example of the cathode electrode 13 shown in FIG. 1.

FIG. 7 is a flowchart showing the operation flow of the anodic oxidation apparatus shown in FIG. 1.

BEST MODE FOR CARRYING OUT THE INVENTION

According to the present invention, while the positional relationship among three, namely, a lamp, a cathode electrode, and a target substrate holder holding a target substrate is roughly maintained, a spatial position of at least one of the three is periodically vibrated. This causes the shadow of the cathode electrode to be dispersed on the target substrate with time, so that photoirradiation amounts onto respective portions of the target substrate during the time required for an anodic oxidation step are averaged in a time integral manner and are made uniform.

Consequently, uniformity of anodic oxidation in the surface of the target substrate can be enhanced.

Hereinafter, embodiments of the present invention will be explained with reference to the drawings.

Figure 1:
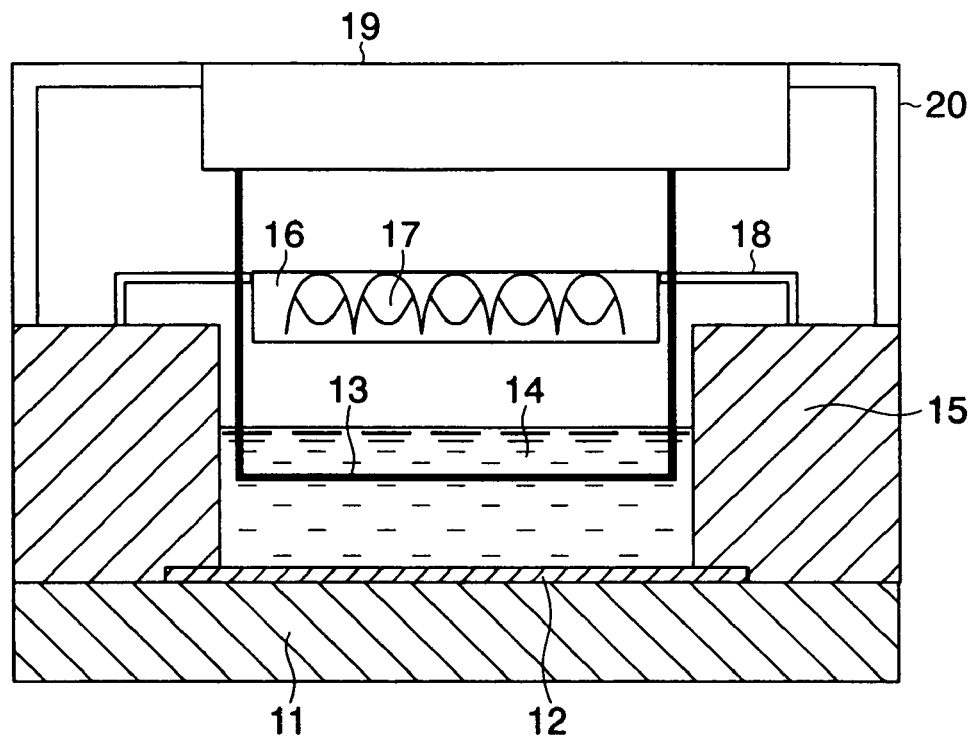
FIG. 1 is a front view schematically showing an anodic oxidation apparatus as an embodiment of the present invention.

FIG. 1 is a front view schematically showing an anodic oxidation apparatus as an embodiment of the present invention. As shown in this drawing, the anodic oxidation apparatus includes a stage 11, a cathode electrode 13, a wall portion 15, a lamp unit 16 having a plurality of lamps 17, a lamp unit supporting member 18, a cathode electrode vibrating mechanism 19, and a cathode electrode vibrating mechanism supporting member 20.

A target substrate 12 (an upper face thereof is a treatment part) is placed and held on the stage 11 as a target substrate holding section, and the wall portion 15 surrounding four sides in a horizontal direction is installed on a peripheral edge of the stage 11 and the target substrate 12. The wall portion 15 is installed in such a manner that the target substrate 12 is placed and held on the stage 11 and thereafter, the wall portion 15 is brought down, for example, from above the target substrate 12. Incidentally, when anodic oxidation is carried out, a chemical (treatment solution) 14 is filled inside the wall portion 15 with the target substrate 12 serving as a bottom portion, and therefore, a seal member (not shown) is provided in a circumferential shape on a portion where the wall portion 15 and the target substrate 12 are in contact with each other. Further, a conductor (not shown) for supplying electricity to the treatment part of the target substrate 12 at the time of the anodic oxidation is provided outside the periphery of the seal member.

When the chemical 14 is filled inside the wall portion 15 with the target substrate 12 serving as the bottom portion, a treatment tank is formed. The chemical can be supplied to the treatment tank, for example, by a supply pipe (not shown) extending into the treatment tank, by a supply passage (not shown) passing through the wall portion 15, or the like. The cathode electrode 13 is provided in the treatment tank to be immersed in the chemical 14 and to face the target substrate 12. The cathode electrode 13 is hung from the cathode electrode vibrating mechanism 19 and can be caused to make a circular movement in a horizontal plane by the cathode electrode vibrating mechanism 19. The planar structure of the cathode electrode 13 will be described later.

The cathode electrode vibrating mechanism 19 is fixed to the wall portion 15 by the cathode electrode vibrating mechanism supporting member 20. The essential structure inside the cathode electrode vibrating mechanism 19 will be described later.

The lamp unit 16 is provided to face the target substrate 12 across the cathode electrode 13, and light emitted therefrom is incident on the target substrate 12 through opening portions of the cathode electrode 13 in a substantially perpendicular direction to the target substrate 12. The lamp unit 16 is fixed to the wall portion 15 by the lamp unit supporting member 18.

Note that in this embodiment, the cathode electrode 13 among the three, namely, the stage 11 on which the target substrate 12 is placed and held, the cathode electrode 13, and the lamp unit 17 is vibrated as described above. This causes the shadow of the cathode electrode 13 produced by the lamp unit 16 to be dispersed on the target substrate 12 with time. Consequently, photoirradiation amounts to respective portions on the target substrate 12 during the time required for the anodic oxidation step are averaged in a time integral manner and are made uniform. This enables enhancement in uniformity of anodic oxidation in the surface of the target substrate.

Figure 2:
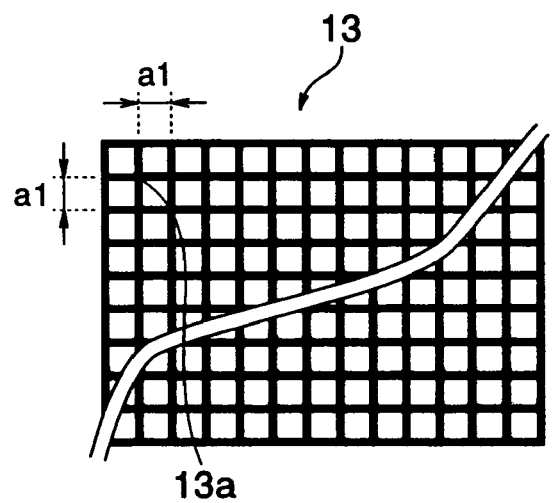
FIG. 2 is a plan view of a cathode electrode 13 shown in FIG. 1.

FIG. 2 is a plan view of the cathode electrode 13 shown in FIG. 1. As shown in FIG. 2, this cathode electrode has a grid structure in which vertical and horizontal pitches are both set to pitch a1, cross points 13a exist at respective intersections of vertical and horizontal strips, and spaces surrounded by the strips constituting the grid are the opening portions to allow the light to pass therethrough. Here, the cathode electrode 13 is so structured, for example, that the material thereof is platinum, the pitch a1 is about 10 mm, and the thickness of each of the strips constituting the grid is about 0.5 mm.

Figure 3:
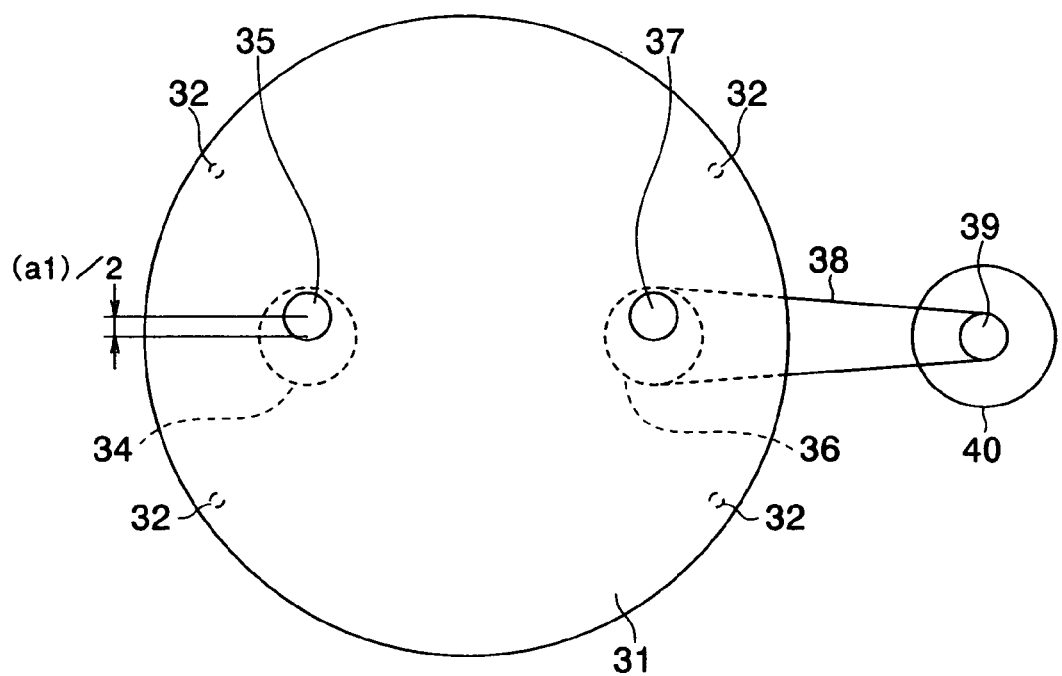
FIG. 3 is a plan view showing an essential part of a cathode electrode vibrating mechanism 19 shown in FIG. 1.

FIG. 3 is a plan view showing an essential part of the cathode electrode vibrating mechanism 19 shown in FIG. 1. As shown in FIG. 3, this essential part has a vibrating plate 31, cathode electrode coupling portions 32, gears 34, 36, vibrating pins 35, 37, a timing belt 38, a gear 39, and a motor 40.

The motor 40 rotates the gear 39, and the rotational force thereof is transmitted to the gear 36 by the timing belt 38. The gear 36 is rotatably supported, with the position of the rotary shaft being fixed. The gear 36 and the vibrating pin 37 have such a relationship that the vibrating pin 37 is fixed eccentrically from the gear 36, and the vibrating pin 37, whose plane shape is circular, is fitted into a through hole provided in the vibrating plate 31. The vibrating pin 37 is slidable relatively to the hole face of this through hole.

The gear 34 and the vibrating pin 35, which have the same relationship as that of the gear 36 and the vibrating pin 37, are so arranged that the gear 34 is rotatably supported with the position of a rotary shaft thereof being fixed, and the vibrating pin 35 is fitted into another through hole provided in the vibrating plate 31. The vibrating pin 35 is slidable relatively to the hole face of this through hole. Note that gear teeth of the gear 34 have no force transmitting element.

The vibrating plate 31 hangingly supports the cathode electrode 13 by the four cathode electrode coupling portions 32 thereof.

With such a structure, the rotation of the motor 40 rotates the gear 39, which in turn rotates the gear 36 via the timing belt 38, so that the vibrating pin 37 makes a circular movement. This induces a certain movement of the vibrating plate 31, but due to the restriction by the vibrating pin 35, the movement is accompanied by the rotation of the gear 34. Consequently, the gear 36 and the gear 34 rotate synchronously, resulting in a circular movement of the vibrating plate 31. This causes the cathode electrode 13 hung from the vibrating plate 31 to also make a circular movement in a horizontal plane.

Here, when eccentricity of the vibrating pin 35 (37) from the rotation center of the gear 34 (36) is set to (a1)/2 as shown in the drawing, such a circular movement is made that the position of the cross point 13a of the cathode electrode 13 does not overlap the position of the adjacent cross point. This makes it possible to minimize regions where the shadow of the cross points 13a is concentrated due to the movement, in consideration of the fact that the shadow becomes darkest on the target substrate 12. Based on the same idea, the eccentricity amount may be an odd multiple of (a1)/2.

Incidentally, in FIG. 2, the grid structure of the cathode electrode 13 is explained as the square grid structure, and the structure of the essential part of the cathode electrode vibrating mechanism 19 as shown in FIG. 3 that is compatible with this square grid structure is shown, but when a rectangular grid structure is adopted as the structure of the cathode electrode 13, the movement caused by the cathode electrode vibrating mechanism 19 is preferably an elliptic movement from the viewpoint of dispersion efficiency of the shadow.

This movement can be realized when the vibrating plate 31 in FIG. 3 makes an elliptic movement instead of the circular movement. As one method of realizing this, for example, the following method is conceivable. First, the gears 36, 34 are installed in an inclined manner so as to look as if they were ellipses on a plan view. The major axes of these apparent ellipses extend in the horizontal direction (or vertical direction) in FIG. 3. The relationship between the gear 36 (34) and the vibrating pin 37 (35) is not fixed, but the vibrating pin 37 (35) is supported so as to be rotatable at a root of the vibrating pin 37 (35) and to incline at an arbitrary angle relatively to a side face of the gear (a face that is not a tooth face). Further, a restricting function is imparted to the through hole of the vibrating plate 31 so that the angle at which the vibrating pin 37 (35) is fitted into the vibrating plate 31 is kept perpendicular.

With this structure, the vibrating pin 37 (35) makes the elliptic movement, so that the elliptic movement of the vibrating plate 31 can be obtained. Consequently, the cathode electrode 13 also makes an elliptic movement. Incidentally, a well-known elliptic movement mechanism that uses an eccentric cam or the like may of course be utilized.

When the cathode electrode 13 has the rectangular grid structure and the vibrating plate 31 makes the elliptic movement, such an elliptic movement is made that the major axis is set to an odd multiple of substantially a half of a longer side distance between the cross points and the minor axis is set to an odd multiple of substantially a half of a shorter side distance between the cross points, so that it is possible to minimize regions where the shadow of the cross points 13a is concentrated due to the movement in consideration of the fact that the shadow becomes darkest on the target substrate 12. This is based on the same reason as that in the circular movement, considering the distance between the adjacent cross points.

Figure 4:
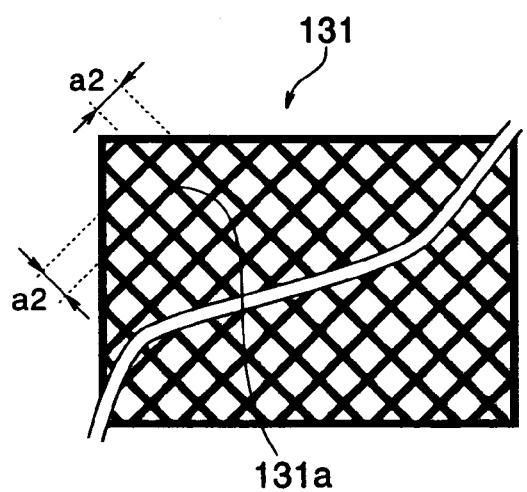
FIG. 4 is a plan view showing another example of the cathode electrode 13 shown in FIG. 1.

Next, another example of a cathode electrode that can be used in the anodic oxidation apparatus shown in FIG. 1 in place of the cathode electrode 13 shown in FIG. 2 will be explained with reference to FIG. 4. FIG. 4 is a plan view showing another example of the cathode electrode 13 shown in FIG. 1. A cathode electrode 131 shown in FIG. 4 has a square grid structure (pitch a2) similarly to that shown in FIG. 2, but strips are set to be inclined at an angle of 45°.

Also in this case, the same effect as that of the cathode electrode 13 shown in FIG. 2 is obtainable through the use of the cathode electrode vibrating mechanism as shown in FIG. 3. However, the eccentricity amount (a1)/2 shown in FIG. 3 is more preferably (a2)/2 or an odd multiple thereof.

In the case of the cathode electrode 131 as shown in FIG. 4, a linear reciprocating movement (in the vertical direction or the horizontal direction in the drawing) instead of the circular movement of the cathode electrode 131 can also bring about the dispersion effect of the shadow with time. This is because the reciprocating movement in these directions results in the movement in the directions other than the longitudinal direction of each strip, so that the shadow of the strips is shifted with time.

FIG. 5 is a plan view showing an essential part of a cathode electrode vibrating mechanism 19 that can be used when the cathode electrode 131 as shown in FIG. 4 is applied to the anodic oxidation apparatus shown in FIG. 1. As shown in FIG. 5, this essential part has restricting members 51, 52, a vibrating plate 53, a connecting joint 54, linkage pins 55, 56, a motor 57, a rotary wheel 58, and cathode electrode coupling portions 32.

The rotation of the motor 57 causes the rotary wheel 58 connected thereto to rotate, so that the linkage pin 56 fixed to the rotating wheel 58 rotates. The rotation of the linkage pin 56 is transmitted to the vibrating plate 53 via the linkage pin 55 by the connecting joint 54, to thereby cause the vibrating plate 53 to make a reciprocating movement. This means that the vibrating plate 53 is restricted in the vertical direction by the restricting members 51, 52. As is seen from the above explanation, this mechanism is a kind of a piston-crank mechanism.

Since the vibrating plate 53 hangingly supports the cathode electrode 131 by the cathode electrode coupling portions 32, the reciprocating movement of the vibrating plate 53 causes the cathode electrode 131 to make a reciprocating movement.

Here, when the eccentricity of the linkage pin 56 on the rotary wheel 58 is set to $(\sqrt{2})(a2)/2$ as shown in the drawing, it is possible to minimize regions where the shadow of the cross points 131a is concentrated due to the movement, in consideration of the fact that the shadow becomes darkest on the target substrate 12. In other words, such a reciprocating movement is made that the position of the cross point 131a of the cathode electrode 131 does not overlap the position of the adjacent cross point. Based on the same idea, the eccentricity of the linkage pin 56 on the rotary wheel 58 may be an odd multiple of $(\sqrt{2})(a2)/2$.

In the explanation on the above-described embodiment, the cathode electrode 13 is moved in a plane perpendicular to the photoirradiation direction to vary the position of the shadow appearing on the target substrate 12 with time, but a method of moving the cathode electrode 13 in a plane substantially parallel to the photoirradiation direction is also adoptable. In this case, the intensity pattern of the shadow appearing on the target substrate 12 varies with time. Therefore, photoirradiation amounts are averaged with time to a greater extent than when the cathode electrode 13 is not at all moved.

This method can be realized when the cathode electrode vibrating mechanisms as shown in FIG. 3 and FIG. 5 are provided, being turned by 90° around a horizontal axis so as to cause the cathode electrodes 13, 131 to make a vertical movement. Further, it is also possible that the cathode electrodes 13, 131 are moved in a plane substantially perpendicular to the photoirradiation direction and are moved also in a plane substantially parallel to the photoirradiation direction. In this case, this movement can be realized when the cathode electrode vibrating mechanism 19 is not fixed to the wall portion 15 but is placed on another vibrating mechanism that causes the cathode electrode vibrating mechanism 19 itself to make a movement.

Next, another example of a cathode electrode that can be used in the anodic oxidation apparatus shown in FIG. 1 in place of the cathode electrodes 13, 131 shown in FIG. 2 and FIG. 4 will be explained with reference to FIG. 6A and FIG. 6B. FIG. 6A and FIG. 6B are a plan view (FIG. 6A) and a front view (FIG. 6B) showing still another example of the cathode electrode 13 shown in FIG. 1.

A cathode electrode 132 shown in FIG. 6A and FIG. 6B is an assembly of plate-shaped members, and is so structured to allow light to pass therethrough in a substantially parallel direction to both of main faces thereof, and spaces between the plate-shaped members are opening portions to allow light pass therethrough. Here, the cathode electrode 132 is so structured, for example, that the material thereof is platinum, the pitch between the plate-shaped members is about 10 mm, the height of each plate-shaped member is about 2 mm, and the thickness thereof is about 0.05 mm to about 0.1 mm.

In such a cathode electrode 132, since a beam by nature tends to pass through the opening portion in a manner shown in FIG. 6B (in other words, light is reflected on both of the main faces of the plate-shaped members), the shadow of the cathode electrode 132 is not easily produced (to be more precise, the shadow is produced in a dispersed manner). When such a cathode electrode 132 is used and is caused to vertically make a reciprocating movement or a circular movement, the dispersion effect of the produced shadow with time can be increased.

Consequently, photoirradiation amounts to respective portions on the target substrate 12 during the time required for the anodic oxidation step are averaged in a time integral manner and are made uniform. This enables enhanced uniformity of anodic oxidation in the surface of the target substrate.

Incidentally, such a movement of the cathode electrode 132 can be realized by providing the moving mechanism as shown in FIG. 3 or FIG. 5 in the cathode electrode vibrating mechanism 19. At this time, the moving mechanism is provided, being turned around the horizontal axis by 90° in order to cause the cathode electrode 132 to make a vertical movement.

Next, a series of operations of the anodic oxidation apparatus shown in FIG. 1 will be explained with reference also to FIG. 7. FIG. 7 is a flowchart showing the operation flow of the anodic oxidation apparatus shown in FIG. 1.

First, the target substrate 12 is placed on the stage 11 while the stage 11 and the wall portion 15 are vertically apart from each other, and this placement state is kept (Step 71). The treatment part of the target substrate 12 faces upward. A substrate transfer mechanism such as a robot may be used for placing the target substrate 12 on the stage 11.

Next, the wall portion 15 is brought down to be installed on the stage 11 and the peripheral edge of the target substrate 12. At this time, the liquid seal is provided between the peripheral edge of the target substrate 12 and the wall portion 15 as previously described, and an electrode of the target substrate 12 and the conductor are brought into contact with each other outside the portion along which the liquid seal is provided. Further, the cathode electrode vibrating mechanism 19 and the lamp unit 16 are fixed to the wall portion 15, so that they are set to predetermined positions relatively to the target substrate 12. Through these processes, the treatment tank is formed (the above process is Step 72).

Next, the chemical is filled in the formed treatment tank (Step 73). This produces the state in which the treatment part of the target substrate 12 and the cathode electrode 13 are in contact with the chemical. The chemical is, for example, a hydrofluoric acid solution using ethyl alcohol as a solvent. For supplying the chemical into the treatment tank, for example, a supply passage may be provided in the wall portion 15 or a supply pipe may be inserted into the treatment tank from the above.

Next, while the cathode electrode 13 is periodically vibrated by the cathode electrode vibrating mechanism 19, the anodic oxidation reaction of the target substrate 12 is caused (Step 74). For this purpose, a driving electric current is supplied between the conductor in contact with the electrode of the target substrate 12 and the cathode electrode 13 by a current source, and the target substrate 12 is irradiated with light by the lamps 17 of the lamp unit 16. The reaction time thereof, though depending on the conditions such as temperature, is several seconds.

Next, the periodic vibration of the cathode electrode 13, the driving electric current supply by the current source between the conductor in contact with the electrode of the target substrate 12 and the cathode electrode 13, and the irradiation of the target substrate 12 by the lamps 17 of the lamp unit 16 are all stopped, and the chemical is discharged. The chemical discharge may be realized, for example, by providing a discharge passage in the wall portion 15 or by inserting a discharge pipe into the treatment tank from the above to suck out the chemical therethrough. Since the chemical has a strong corrosive property, the treatment tank together with the target substrate 12 is washed thereafter. The washing for this purpose can be conducted, for example, by repeating the supply and discharge of a wash to and out of the treatment tank (the above process is Step 75). Through these processes, a series of the anodic oxidation step of the target substrate 12 can be completed.

In the above-described embodiments, such structures that the cathode electrodes 13, 131, 132 are periodically vibrated are explained, but, instead of these structures or in addition to these structures, such a structure that the lamp unit 16 or the stage 11 is periodically vibrated can also realize improvement in uniformity of the anodic oxidation over the surface of the target substrate 12 owing to the shadow dispersion effect.

The periodic vibration of the lamp unit 16 is realized, for example, by hanging the lamp unit 16 from a mechanism similar to the cathode electrode vibrating mechanism 19. The periodic vibration of the stage 11 is realized in such a manner that, after the support of the lamp unit supporting member 18 and the cathode electrode vibrating mechanism supporting member 20 onto the wall portion 15 is released, the stage 11, the target substrate 12, and the wall portion 15 are periodically vibrated as one unit. This is realized also by providing a mechanism similar to the cathode electrode vibrating mechanism 19 under the stage 11.

INDUSTRIAL APPLICABILITY

An anodic oxidation apparatus according to the present invention can be manufactured in the manufacturing industry of equipment for producing display devices, and further, it is usable in the display device manufacturing industry. An anodic oxidation method according to the present invention is usable in the display device manufacturing industry. Therefore, both of them are industrially applicable.

What is claimed is:

1. An anodic oxidation apparatus comprising:
a lamp that emits light;
a target substrate holder provided at a position reached by the emitted light and capable of holding a target substrate;
a cathode electrode that is provided on a way of the emitted light to reach the held target substrate and that has an opening portion to allow the light to pass therethrough and has a conductor section not transmitting the light; and
a vibrating mechanism to periodically vibrate a spatial position of the cathode electrode.

2. An anodic oxidation apparatus as set forth in claim 1, wherein the vibrating mechanism vibrates the cathode electrode on a plane substantially perpendicular to an irradiation direction of the emitted light.

3. An anodic oxidation apparatus as set forth in claim 2, wherein the vibrating is one of a reciprocating movement, a circular movement, and an elliptic movement.

4. An anodic oxidation apparatus as set forth in claim 3, wherein the cathode electrode has a square grid structure with the conductor section having cross points, and
wherein the circular movement is a circular movement of said cathode electrode, a radius of the circular movement being an odd multiple of substantially a half of a distance between the cross points of the square.

5. An anodic oxidation apparatus as set forth in claim 3, wherein the cathode electrode has a grid structure with the conductor section having cross points, and
wherein the reciprocating movement is a reciprocating movement of the cathode electrode in a diagonal distance direction, an amplitude of the reciprocating movement being an odd multiple of substantially a half of the diagonal distance between the cross points.

6. An anodic oxidation apparatus as set forth in claim 3, wherein the cathode electrode has a rectangular grid structure with the conductor section having cross points, and
wherein the elliptic movement is an elliptic movement of the cathode electrode, a major axis of the elliptic movement being an odd multiple of substantially a half of a longer side distance between the cross points and a minor axis of the elliptic movement being an odd multiple of substantially a half of a shorter side distance between the cross points.

7. An anodic oxidation apparatus as set forth in claim 1, wherein the vibrating mechanism vibrates the cathode electrode on a plane substantially parallel to an irradiation direction of the emitted light.

8. An anodic oxidation apparatus as set forth in claim 7, wherein the vibrating is one of a reciprocating movement, a circular movement, and an elliptic movement.

9. An anodic oxidation apparatus as set forth in claim 8, wherein the cathode electrode is an assembly of plate-shaped members each having a main face substantially parallel to the irradiation direction of the emitted light.

10. An anodic oxidation method comprising:
holding a target substrate by a target substrate holder;
bringing a treatment part of the held target substrate and a cathode electrode into contact with a chemical;
supplying a driving electric current between the treatment part and the cathode electrode that are brought into contact with the chemical;
irradiating the treatment part brought into contact with the chemical with light by a lamp; and
periodically vibrating a spatial position of the cathode electrode brought into contact with the chemical.

11. An anodic oxidation method comprising:
irradiating a target substrate brought into contact with a treatment solution with light, and vibrating, relatively to the target substrate, a cathode electrode that is disposed between a lamp unit facing the target substrate and the target substrate, and that has an opening portion to allow light to pass therethrough.

12. An anodic oxidation method as set forth in claim 11, wherein the cathode electrode is vibrated in a plane parallel to the target substrate.

* * * * *